(12) United States Patent
Hohage et al.

(10) Patent No.: US 7,341,903 B2
(45) Date of Patent: Mar. 11, 2008

(54) METHOD OF FORMING A FIELD EFFECT TRANSISTOR HAVING A STRESSED CHANNEL REGION

(75) Inventors: Joerg Hohage, Dresden (DE); Hartmut Ruelke, Dresden (DE); Kai Frohberg, Meissen (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/177,774

(22) Filed: Jul. 8, 2005

(65) Prior Publication Data

US 2006/0113641 A1    Jun. 1, 2006

(30) Foreign Application Priority Data

Nov. 30, 2004   (DE) .................. 10 2004 057 762

(51) Int. Cl.
   *H01L 21/8238*   (2006.01)
(52) U.S. Cl. ............... 438/199; 438/230; 257/E21.292; 257/E21.293
(58) Field of Classification Search .......... 438/199, 438/230; 257/E21.292, E21.293
See application file for complete search history.

(56) References Cited

U.S. PATENT DOCUMENTS

| | | | |
|---|---|---|---|
| 6,825,529 B2 * | 11/2004 | Chidambarrao et al. | 257/336 |
| 7,189,436 B2 * | 3/2007 | Kohler et al. | 427/489 |
| 2003/0181005 A1 | 9/2003 | Hachimine et al. | |
| 2004/0029323 A1 | 2/2004 | Shimizu et al. | |
| 2004/0104405 A1 | 6/2004 | Huang et al. | |
| 2004/0217420 A1 | 11/2004 | Yeo et al. | |
| 2005/0285137 A1 * | 12/2005 | Satoh | 257/178 |

OTHER PUBLICATIONS

A definition of SUBSTANTIAL in Merriam-Webster onLine.*

* cited by examiner

*Primary Examiner*—Matthew Smith
(74) *Attorney, Agent, or Firm*—Williams, Morgan & Amerson, P.C.

(57) ABSTRACT

A semiconductor structure comprises a transistor element formed in a substrate. A stressed layer is formed over the transistor element. The stressed layer has a predetermined compressive intrinsic stress having an absolute value of about 1 GPa or more. Due to this high intrinsic stress, the stressed layer exerts considerable elastic forces to the channel region of the transistor element. Thus, compressive stress is created in the channel region. The compressive stress leads to an increase of the mobility of holes in the channel region.

14 Claims, 10 Drawing Sheets

METHOD OF FORMING A FIELD EFFECT TRANSISTOR HAVING A STRESSED CHANNEL REGION

BACKGROUND OF THE INVENTION

1. Field of the Invention

The present invention relates to the formation of integrated circuits, and, more particularly, to the formation of field effect transistors having a channel region with a specified intrinsic stress to improve the charge carrier mobility.

2. Description of the Related Art

Integrated circuits comprise a large number of individual circuit elements such as, e.g., transistors, capacitors and resistors. These elements are connected internally to form complex circuits such as memory devices, logic devices and microprocessors. The performance of integrated circuits can be improved by increasing the number of functional elements in the circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They allow control of a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

The source region, the drain region and the gate electrode of a field effect transistor in an integrated circuit are connected to other circuit elements by means of contact vias which are formed in a layer of an interlayer dielectric over the transistor. Since the source and drain regions and the gate electrode have different heights, and a surface of the interlayer dielectric is substantially planar, the individual contact vias have different depths. In the formation of the contact vias, a mask is formed on the interlayer dielectric which exposes those portions of the interlayer dielectric where the contact vias are to be formed. Then, an anisotropic etching process is performed. In order to insure that an etchant used in the etching process does not affect the transistor, an etch stop layer is provided between the transistor and the interlayer dielectric. The etchant is adapted to selectively remove the interlayer dielectric, leaving a material of the etch stop layer substantially intact. Thus, the etching stops as soon as the etch front reaches the etch stop layer, irrespective of the height of the feature below the contact via.

When reducing the size of field effect transistors, it is important to maintain a high conductivity of the channel region in the "on" state. The conductivity of the channel region in the "on" state depends on the dopant concentration in the channel region, the mobility of the charge carriers, the extension of the channel region in the width direction of the transistor and on the distance between the source region and the drain region, which is commonly denoted as "channel length." While a reduction of the width of the channel region leads to a decrease of the channel conductivity, a reduction of the channel length enhances the channel conductivity. An increase of the charge carrier mobility leads to an increase of the channel conductivity.

As feature sizes are reduced, the extension of the channel region in the width direction is also reduced. A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source region and in the drain region in order to provide a low sheet resistivity and a low contact resistivity in combination with a desired channel controllability. Furthermore, a reduction of the channel length may entail a need to reduce the depth of the source region and the drain region with respect to the interface formed by the gate insulation layer and the channel region which may, in some approaches, be achieved by forming raised source and drain regions formed with a specified offset to the gate electrode.

In view of the problems associated with a further reduction of the channel length, it has been proposed to also enhance the performance of field effect transistors by increasing the charge carrier mobility in the channel region. In principle, at least two approaches may be used to increase the charge carrier mobility.

First, the dopant concentration in the channel region may be reduced. Thus, the probability of scattering events of charge carriers in the channel region is reduced, which leads to an increase of the conductivity of the channel region. Reducing the dopant concentration in the channel region, however, significantly affects the threshold voltage of the transistor device. This makes the reduction of dopant concentration a less attractive approach.

Second, the lattice structure in the channel region may be modified by creating tensile or compressive stress. This leads to a modified mobility of electrons and holes, respectively. A compressive stress in the channel region increases the mobility of holes. Depending on the magnitude of the compressive stress, an increase of the hole mobility of up to 15% may be achieved. In a P-type transistor, this leads to a corresponding increase of the conductivity of the channel region. Conversely, a tensile stress in the channel region increases the mobility of electrons. Thus, the performance of N-type transistors may be enhanced by providing a tensile stress in the channel region.

In a method of forming field effect transistors having stressed channel regions according to the state of the art, a layer comprising an alloy of silicon and carbon or an alloy of silicon and germanium, respectively, is introduced into the channel region in order to create a compressive or tensile stress. Alternatively, such a stress-creating layer may be provided below the channel region.

A problem of the method of forming field effect transistors having stressed channel regions according to the state of the art is that the formation of the stress-creating layer requires a considerable modification of conventional and well-approved techniques used for the formation of field effect transistors. For instance, additional epitaxial growth techniques have to be developed and implemented into the process flow in order to form the stress-creating layers. Thus, the complexity of the formation of the transistors is significantly increased compared to the formation of transistors without stress-creating layers in or below the channel region.

In view of the above problems, a need exists for a method allowing creation of desired stress conditions in a field effect transistor without requiring substantial modifications of the manufacturing process.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a method of forming a semiconductor structure comprises providing a substrate comprised of a transistor element. A stressed layer is formed over the transistor element. The stressed layer has a predetermined compressive intrinsic stress. The predetermined compressive intrinsic stress has an absolute value of at least about 1 GPa.

According to another illustrative embodiment of the present invention, a method of forming a semiconductor structure comprises providing a substrate comprised of a first transistor element and a second transistor element. A first stressed layer is formed over the first transistor element. A second stressed layer is formed over the second transistor element. The second stressed layer does not cover the first transistor element. At least one of the first stressed layer and the second stressed layer has a predetermined compressive intrinsic stress. The predetermined compressive intrinsic stress has an absolute value of at least about 1 GPa.

According to yet another illustrative embodiment of the present invention, a semiconductor structure comprises a substrate comprised of a transistor element. Over the transistor element, a stressed layer is formed. The stressed layer has a predetermined compressive intrinsic stress. The predetermined compressive intrinsic stress has an absolute value of at least about 1 GPa.

According to yet another illustrative embodiment of the present invention, a semiconductor structure comprises a substrate comprised of a first transistor element and a second transistor element. A first stressed layer is formed over the first transistor element. A second stressed layer is formed over the second transistor element. The second stressed layer does not cover the first transistor element. At least one of the first stressed layer and the second stressed layer has a predetermined compressive intrinsic stress. The predetermined compressive intrinsic stress has an absolute value of at least about 1 GPa.

BRIEF DESCRIPTION OF THE DRAWINGS

The invention may be understood by reference to the following description taken in conjunction with the accompanying drawings, in which like reference numerals identify like elements, and in which.

Figure 1:
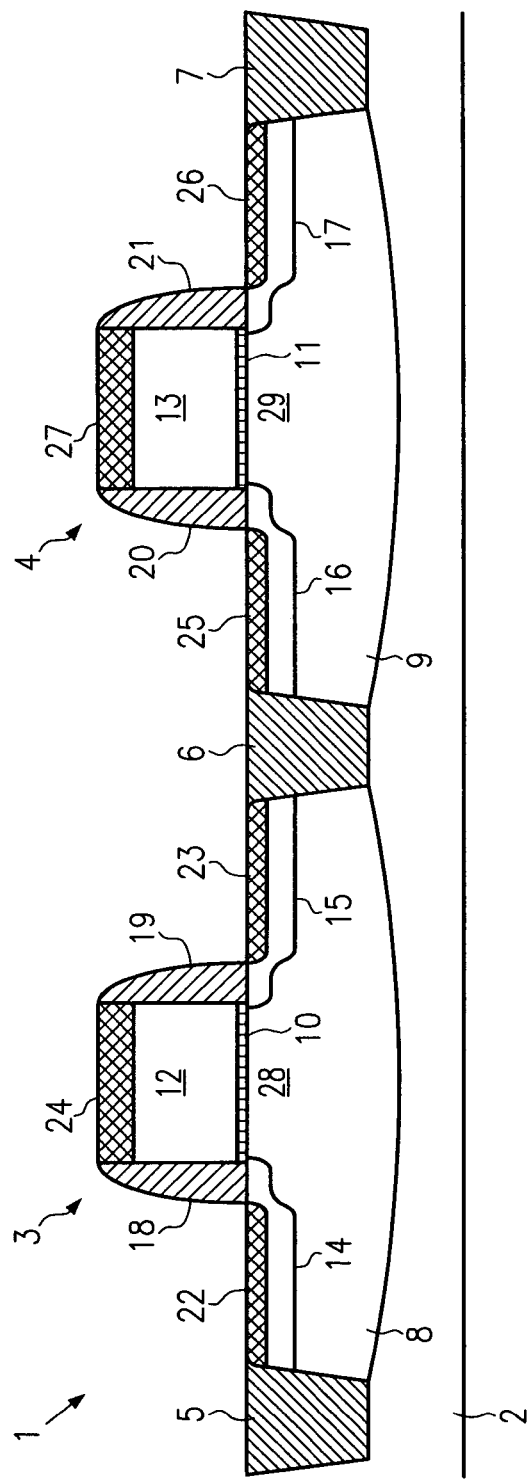
FIG. 1 shows a schematic cross-sectional view of a semiconductor structure.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention allows the formation of a semiconductor structure comprising a transistor element, the channel region of which is exposed to a compressive mechanical stress. To this end, a stressed layer which may have a predetermined compressive intrinsic stress having an absolute value of about 1 GPa or more is formed over the transistor element. Due to this high intrinsic stress, the stressed layer exerts considerable elastic forces to the channel region of the transistor element. Thus, compressive stress is created in the channel region. This compressive stress leads to an increase of the mobility of holes in the channel region. In some embodiments of the present invention, the stressed layer may be used as an etch stop layer in the formation of contact vias through a layer of an interlayer dielectric formed over the transistor element.

In further embodiments of the present invention, the semiconductor structure may comprise transistor elements, the channel regions of which are exposed to different mechanical stress. To this end, stressed layers having different stress properties can be formed over the transistor elements. One of the stressed layers can have a predetermined compressive intrinsic stress having an absolute value of about 1 GPa or more. Thus, transistor elements under this stressed layer can be exposed to a compressive stress, which leads to an increase of the mobility of holes in the channel region thereof.

With reference to the drawings, further illustrative embodiments of the present invention will now be described in more detail. FIG. 1 shows a schematic cross-sectional view of a semiconductor structure 1. The semiconductor structure 1 comprises a substrate 2. The substrate 2 comprises a first transistor element 3 and a second transistor element 4. Shallow trench isolations 5, 6, 7 electrically insulate the transistor elements 3, 4 from each other and from other circuit elements in the semiconductor structure 1.

The first transistor element 3 comprises an active region 8. In the active region 8, a source region 14 and a drain region 15 are formed adjacent a channel region 28. Over the channel region 28, a gate electrode 12 which is separated from the active region 8 by a gate insulation layer 10 is formed. Sidewall spacers 18, 19 are formed adjacent the gate electrode 12. The source region 14 comprises a metal silicide region 22. Similarly, the drain region 15 comprises a metal silicide region 23. A further metal silicide region 24 is formed on the gate electrode 12.

Similar to the first transistor element 3, the second transistor element 4 comprises an active region 9, a source region 16, a drain region 17, a channel region 29, a gate electrode 13, a gate insulation layer 11, sidewall spacers 20, 21 and metal silicide regions 25, 26, 27 formed in the source region 16, the drain region 17 and the gate electrode 13, respectively.

A method of forming the semiconductor structure 1 will be described with reference to FIG. 1. First, the trench isolations 5, 6, 7 and the active regions 8, 9 are formed in the substrate 2. Then, the gate insulation layers 10, 11 and the gate electrodes 12, 13 are formed over the substrate 2. This can be done by means of known advanced techniques of ion implantation, oxidation, deposition and photolithography. Subsequently, dopant ions are implanted into the source regions 14, 16 and the drain regions 15, 17. Then, the sidewall spacers 18, 19, 20, 21 are formed adjacent the gate electrodes 12, 13, which may be done by means of conformally depositing a layer of a spacer material over the substrate 2 and performing an anisotropic etching process, as is known to persons skilled in the art. The source regions 14, 16 and the drain regions 15, 17 are then completed by a further implantation of dopant ions. In this implantation, the sidewall spacers 18, 19, 20, 21 protect portions of the source regions 14, 16 and the drain regions 15, 17 adjacent the gate electrodes 12, 13 from being irradiated with ions. Thus, the source and drain regions comprise source extensions and drain extensions, respectively, which are shallower than the rest of the source and drain regions. Finally, the metal silicide regions 22, 23, 24, 25, 26, 27 are formed by depositing a refractory metal layer which may comprise, e.g., cobalt, over the substrate 2 and annealing the semiconductor structure 1 to initiate a chemical reaction between the metal and the silicon in the source regions 14, 16, the drain regions 15, 17 and the gate electrodes 12, 13.

In some embodiments of the present invention, one of the transistor elements 3, 4 is a P-type transistor, whereas the other of the transistor elements 3, 4 is an N-type transistor. In such embodiments, in each of the ion implantation processes performed in the formation of the source regions 14, 16 and the drain regions 15, 17, one of the transistor elements 3, 4 is covered by a first mask (not shown). Then, the semiconductor structure 1 is irradiated with ions of a first dopant, e.g., an N-type dopant such as arsenic. Subsequently, the first mask is removed and the other transistor element is covered by a second mask (not shown). Then, the semiconductor structure 1 is irradiated with ions of a second dopant, e.g., a P-type dopant such as boron.

Further stages of a method of forming a semiconductor structure according to the present invention are shown in FIGS. 2a-2e. First, a semiconductor structure 1 as described above with reference to FIG. 1 is provided. A first stressed layer 201 is formed over the first transistor element 3 and the second transistor element 4. The first stressed layer 201 has a first predetermined intrinsic stress. In one illustrative embodiment, the first stressed layer 201 can be formed by means of plasma enhanced chemical vapor deposition.

Figure 3:
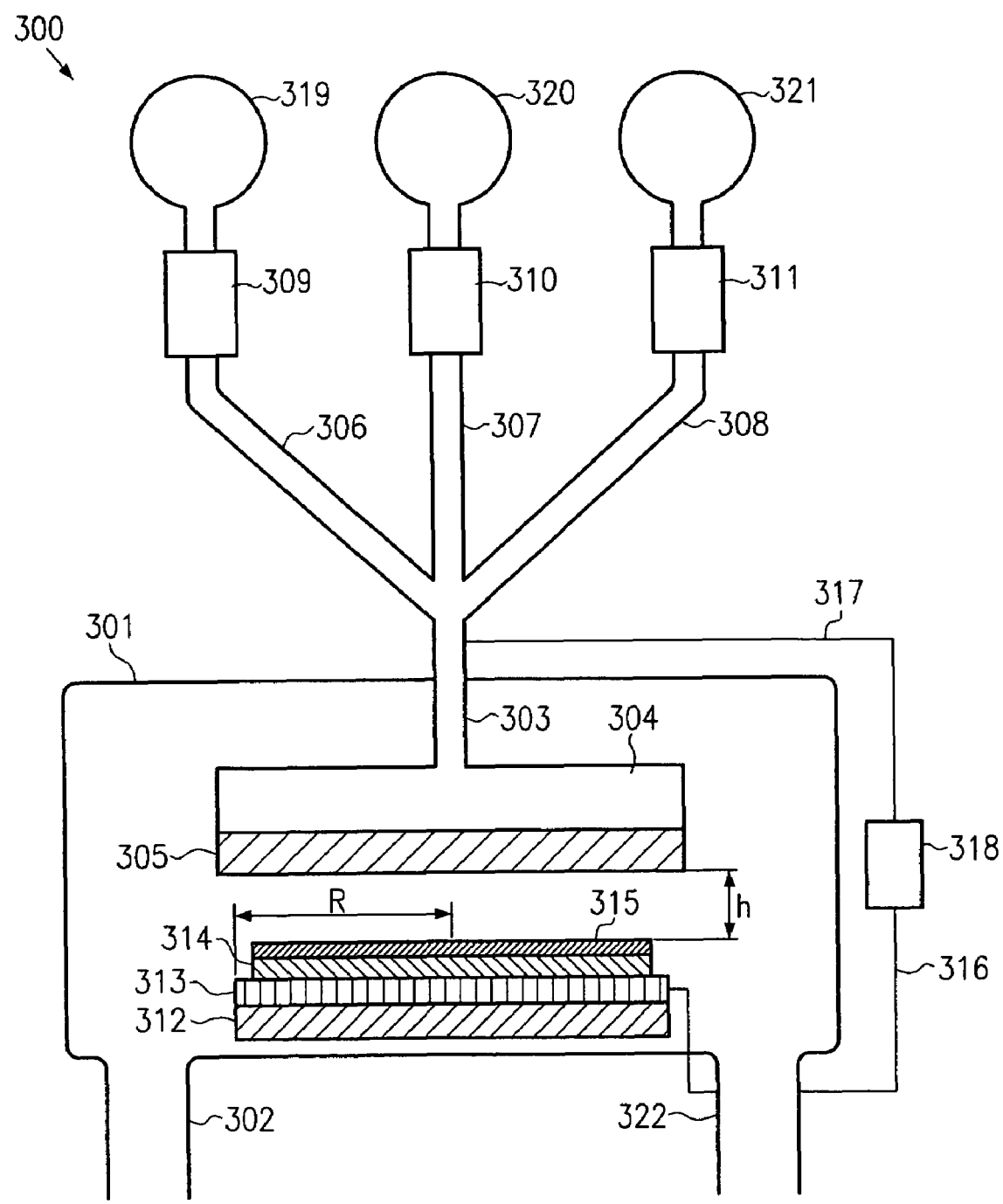
FIG. 3 shows a schematic cross-sectional view of a reactor adapted for plasma enhanced chemical vapor deposition.

Plasma enhanced chemical vapor deposition will now be described with reference to FIG. 3, showing a schematic cross-sectional view of a reactor 300 for plasma enhanced chemical vapor deposition. The reactor 300 comprises a vessel 301. In the vessel 301, a substrate 314 is provided over an electrode 313 and a heater 312. The heater 312 has a radius R and is adapted to maintain the substrate 314 at a predetermined temperature. A showerhead 303 is provided above the substrate 314 and the electrode 313. A spacing h separates the showerhead 303 from the substrate 314. In one particular embodiment of the present invention, the radius R may have a value of about 110 mm and the vessel 301 may have a volume of about 13,000 cm$^3$. The spacing h may be varied, e.g., by moving the showerhead 303 or the substrate 314. The showerhead 303 and the electrode 313 are connected to a power source 318 by means of wires 316, 317.

The showerhead 303 comprises a plenum 304. Lines 306, 307, 308 connect the plenum 304 to gas sources 319, 320, 321. Each of the gas sources 319, 320, 321 can be adapted to provide a gas of a particular species. In particular, the gases provided by gas sources 319, 320, 321 may comprise gaseous reactants and/or background gases provided for diluting the reactants. Mass flow controllers 309, 310, 311 are adapted to regulate a gas flow from the gas sources 319, 320, 321 to the plenum 304. A distribution plate 305 separates the plenum 304 from an inner volume of the vessel 301. The distribution plate 305 is gas permeable and may comprise channels and/or pores (not shown) through which the reactants can flow from the plenum 304 to the inner volume of the vessel 301.

The power source 318 can be adapted to apply a radio-frequency alternating voltage between the showerhead 303 and the electrode 313. Additionally, the power source 318 may be adapted to apply a direct voltage or a low-frequency alternating voltage which is denoted as "bias voltage" between the showerhead 303 and the electrode 313. In other embodiments of the present invention, the reactor 300 may comprise two separate power sources adapted to provide the radio-frequency alternating voltage and the bias voltage, respectively.

Gases may leave the vessel 301 through exhaust ports 302, 322. The exhaust ports 302, 322 may be connected to vacuum pumps (not shown) which are adapted to control a pressure in the vessel 301.

In the operation of the reactor 301, a first gas flows from the gas source 319 to the plenum 304. The flow of the first gas is controlled by mass flow controller 309. Similarly, a second gas and a third gas flow from the gas source 320 and the gas source 321, respectively, to the plenum 304. The flow of the second and the third gas is controlled by mass flow controllers 310 and 311, respectively.

In the plenum, the gases mix with each other. The gas mixture flows through the distribution plate 305 into the vessel 301. A flow direction of the gas mixture is directed towards the substrate 314. The radio frequency alternating voltage and/or the bias voltage applied between the showerhead 303 and the electrode 313 induce a glow discharge in a volume between the showerhead 303 and the substrate 314. Due to the glow discharge, a plasma is created from the gas mixture. The plasma comprises species such as, e.g., ions, radicals and atoms and molecules, respectively, in excited states having a high reactivity. As the flow of the gas mixture and/or the plasma approaches the substrate 314, it is deflected from its flow direction and obtains a radial velocity directed towards a circumference of the substrate 314.

On the substrate 314, or in the vicinity thereof, a chemical reaction occurs between the gaseous reactants and/or species created therefrom in the plasma. Solid products of the chemical reaction are deposited on the substrate 314 and form a material layer 315 on a deposition surface thereof. Gaseous products of the chemical reaction, unconsumed reactants and background gases leave the vessel 301 through exhaust ports 302, 322.

Plasma enhanced chemical vapor deposition may be preceded by a preparation of the reactor 300. In the preparation, the substrate 314 is inserted into the vessel 301. Then, gas flow from the gas sources 319, 320, 321 to the plenum 304 is turned on, and the substrate 314 is heated up by the heater 312. Thus, the gas flow through the reactor 300, the pressure in the vessel 301 and the temperature of the substrate 314 are stabilized. The preparation of the reactor 300 may also comprise an adjustment of the spacing h, which can be performed by a positioning of the heater 312 and/or the showerhead 303. The power source 318, however, is not activated in the preparation of the reactor. Hence, no plasma is created in the volume between the substrate 314 and the showerhead 303. Therefore, substantially no material is deposited on the deposition surface of the substrate 314.

After the plasma enhanced chemical vapor deposition, the reactor 300 can be purged. In the purging, a chemically inert gas is flown through the reactor 300. Thus, residues of reactant gases and particles formed by gas phase reactions are removed from the vessel 301. In the purging, the spacing h between the substrate 314 and the showerhead 303 may be about the same as in the plasma enhanced chemical vapor deposition. In other embodiments of the present invention, in the purging, the spacing h may be greater than in the plasma enhanced chemical vapor deposition.

The properties of the plasma enhanced chemical vapor deposition process and the material layer 315 created thereby are influenced by parameters such as the kind of reactants used, the flows of the individual reactants, the spacing h, the temperature of the substrate, the power of the radio frequency alternating voltage and the bias voltage.

Changing the spacing h alters the volume of the plasma, and hence the surface-to-volume ratio between an area of the deposition surface of the substrate 314 and the volume of the plasma is modified. This may affect a residence time of particles in the plasma, a consumption rate of the reactants, and the radial velocities of gases flowing over the substrate. Thus, the extent of gas phase reactions, characteristics of the gas flow and a radial uniformity of the deposited material layer 315 can be influenced. Additionally, changes of the spacing h may have effects on density and potential of the plasma. The density of the plasma can also be controlled by varying the power of the radio frequency alternating voltage and/or the pressure in the vessel 301. Variations of the bias voltage may alter the velocity at which ions, which are accelerated in the electric field generated by the bias voltage, impinge on the substrate 314. The temperature of the substrate 314 may affect the rate of chemical reactions occurring on the deposition surface. The above-mentioned parameters may also have an influence on an intrinsic stress of the layer 315, which may be controlled by varying one or more of the parameters.

In the formation of the first stressed layer 201, the semiconductor structure 1 can be provided as the substrate 314 in the reactor 300. The deposition surface may comprise surfaces of the source regions 14, 16, the drain regions 15, 17, the gate electrodes 12, 13, the sidewall spacers 18, 19, 20, 21 and the shallow trench isolations 5, 6, 7.

The first stressed layer 201 can comprise a dielectric material, e.g., silicon nitride or silicon carbide. The first predetermined intrinsic stress may be a compressive stress and may have an absolute value of at least about 1 GPa. In some embodiments of the present invention, the absolute value of the first predetermined intrinsic stress may be in a range from about 1 GPa to about 2.2 GPa.

A first stressed layer 201 comprised of silicon nitride having a compressive intrinsic stress having an absolute value of about 2 GPa can be deposited by means of plasma enhanced chemical vapor deposition processes, as will be detailed in the following.

In the embodiment where the first stressed layer 201 is comprised of silicon nitride, the gas sources 319, 320, 321 are adapted to provide silane, ammonia and nitrogen, respectively. The mass flow controller 309 is adapted to control a silane flow to the showerhead 303. Similarly, the mass flow controllers 310 and 311 are adapted to control an ammonia flow and a nitrogen flow, respectively, to the showerhead 303.

Prior to the deposition, the semiconductor structure 1 is inserted into the vessel 301 as the substrate 314. The reactor 300 is prepared. In the preparation, a silane flow in a range from about 70-130 sccm, for example a silane flow of about 100 sccm, an ammonia flow in a range from about 250-550 sccm, for example an ammonia flow of about 400 sccm, and a nitrogen flow in a range from about 9200-10000 sccm, for example a nitrogen flow of about 9600 sccm, are provided. The pressure in the vessel 301 is controlled to be in a range from about 4.2-4.8 Torr. For example, the pressure can be about 4.5 Torr. The heater 312 is controlled to provide a temperature of the semiconductor structure 1 of about 400° C. The spacing h is in a range from about 300-500 mils. For example, the spacing h can be about 400 mils. The power source 318 is in an off-state. The preparation is performed for about 15 seconds.

Then, the first stressed layer 201 is deposited. To this end, the power source 318 is activated to provide a radio frequency alternating voltage between the electrode 313 and the showerhead 303 having a power of about 680 W. The other parameters may be substantially identical to those applied in the preparation. Due to the radio frequency alternating voltage, a plasma is created between the semiconductor structure 1 and the showerhead 303, a chemical reaction occurs, and silicon nitride is deposited on the semiconductor structure 1. The deposition may be performed for about 9 seconds in order to obtain a first stressed layer having a thickness of about 500 Å. A greater or smaller thickness of the first stressed layer 201 may be obtained by correspondingly increasing or reducing the deposition time. A thickness of the first stressed layer may be in a range of from about 200-1500 Å.

In a plasma enhanced chemical vapor deposition process according to the present invention, the bias voltage can be about zero. Thus, advantageously, the probability of arcing in channels of the showerhead 303 is kept low.

After the deposition, the reactor 300 is purged. To this end, a nitrogen flow in a range from about 9200-10000 sccm, for example a nitrogen flow of about 9600 sccm is provided. The silane flow and the ammonia flow are about zero. The power source 318 is in an off state, and the temperature of the semiconductor structure 1 is maintained at 400° C. The purging can be performed for about 20 seconds. Finally, gases in the vessel 301 can be pumped off through the exhaust ports 302, 303, which may take about 15 seconds. In the purging and while pumping off the gases, the spacing h may be maintained in the range from about 300-500 mils, for example at about 400 mils. Advantageously, providing about the same spacing during deposition, purging and pumping reduces the condensation rate of gas phase nuclei on the film surface, thus improving the quality of the film.

In other embodiments of the present invention, parameters of the plasma enhanced chemical vapor deposition process may be modified to obtain a different first predetermined intrinsic stress.

Smaller values of the power of the radio frequency alternating voltage yield smaller absolute values of the first predetermined intrinsic stress. For example, a compressive first predetermined intrinsic stress having an absolute value in a range from about 1-2.2 GPa may be obtained by varying the power of the radio frequency alternating voltage between 550-730 W.

In some embodiments of the present invention, the vessel 301 comprises two wafer stations, each comprising a showerhead similar to the showerhead 303, a heater similar to the heater 312 and an electrode similar to the electrode 313. On each electrode, a substrate may be provided. A power source similar to the power source 318 can be provided for each of the wafer stations. Thus, plasma enhanced chemical vapor deposition may advantageously be carried out for two substrates simultaneously.

The plasma enhanced chemical vapor deposition process described above may be performed in an Applied Materials Producer CVD system comprising a twin chamber known to persons skilled in the art.

A plasma enhanced chemical vapor deposition process may be performed by means of reactors of different size. This may require an adaptation of some of the parameters of the deposition process. For example, gas flows may be scaled in relation to the volume of the vessel 301, wherein ratios between the gas flows are maintained. A power of the radio frequency alternating voltage may be scaled in relation to an area of the surface of the substrate 314.

Advantageously, the plasma enhanced chemical vapor deposition process described above yields silicon nitride films having a low in-film particle level and a low non-uniformity. Using methods known to persons skilled in the art, non-uniformities of about 1-2% have been measured.

The first stressed layer 201 may provide a barrier against copper diffusion. Diffusion barrier properties of a silicon nitride layer formed by means of a plasma enhanced chemical vapor deposition process according to the present invention have been investigated by means of experiments. To this end, silicon nitride layers having a compressive stress were deposited on silicon substrates by means of the process described above. The silicon nitride layers had a thickness of 500 Å. The silicon nitride layers were covered by copper layers having a thickness of 1000 Å. Then, an annealing of one hour was performed at a temperature of 450° C.

Figure 4:
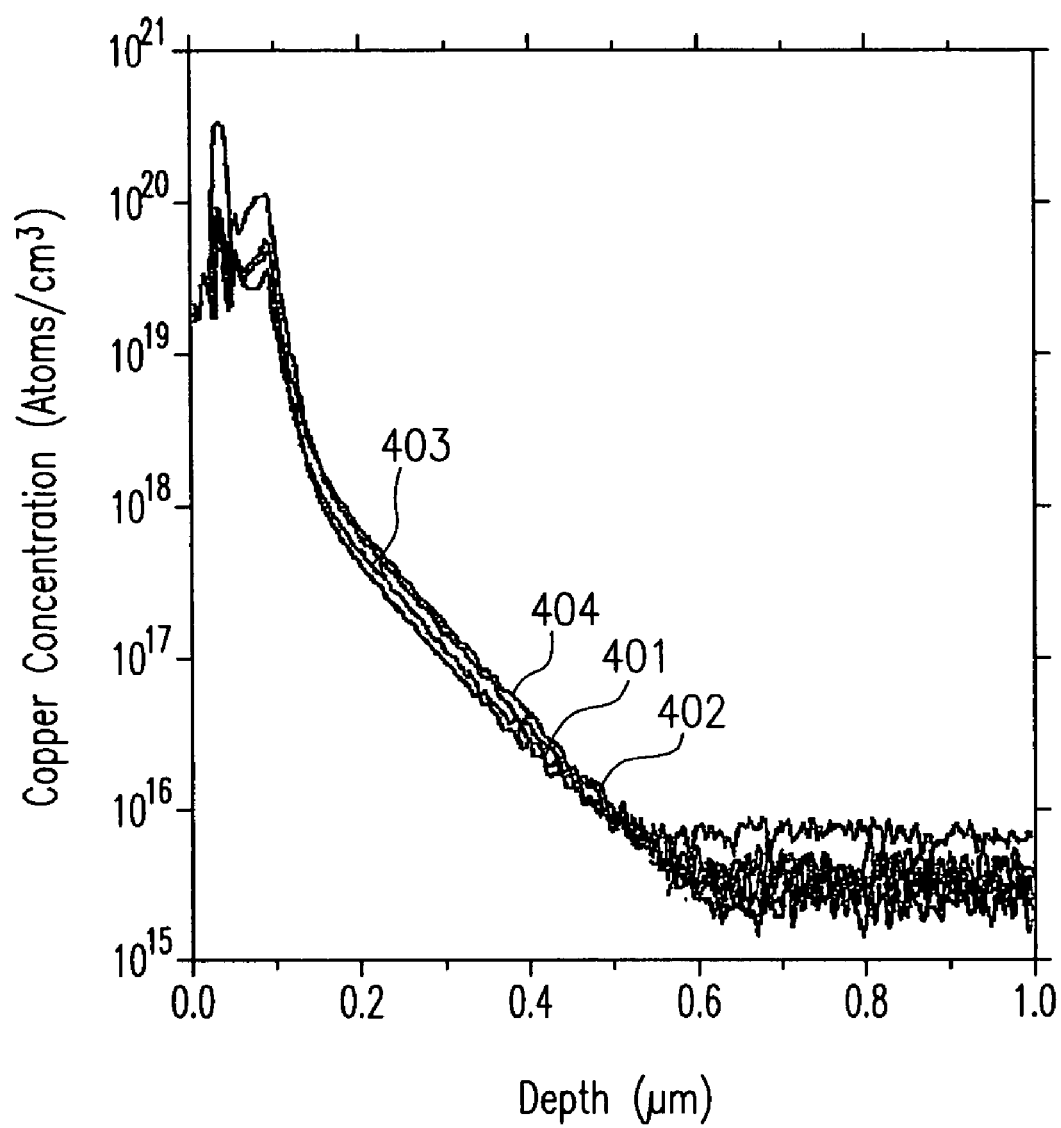
FIG. 4 shows copper concentrations in silicon nitride layers illustrating diffusion barrier properties of a stressed layer in a semiconductor structure according to the present invention.

Subsequently, a copper concentration in the silicon nitride layers and the silicon substrates was measured by means of secondary ion mass spectroscopy, which is well known to persons skilled in the art. FIG. 4 shows two measurement curves 401, 402 of the copper concentration as a function of a depth which were obtained from two different substrates.

Similar investigations have been performed for substantially unstressed silicon nitride layers (measurement curves 403, 404). The substantially unstressed silicon nitride layers were formed by means of a plasma enhanced chemical vapor deposition process, which will be described in the following.

First, the substrate is inserted into the reactor. Then, the reactor 300 is prepared with the power source 318 being in an off state. In the preparation, a silane flow in a range from about 120-180 sccm, for example a silane flow of about 150 sccm, an ammonia flow in a range from about 210-310 sccm, for example an ammonia flow of about 260 sccm, and a nitrogen flow in a range from about 7600-9600 sccm, for example a nitrogen flow of about 8600 sccm, are provided. The pressure in the vessel 301 is controlled to be in a range from about 4.3-5.3 Torr. For example, the pressure may be about 4.8 Torr. The substrate temperature is about 400° C. The spacing h is in a range from about 600-700 mils. For example, the spacing h can be about 650 mils. The preparation is performed for about 15 seconds.

Then, the first stressed layer 201 is deposited. To this end, the power source 318 is activated to provide a radio frequency alternating voltage between the electrode 313 and the showerhead 303 having a power of about 520 W. The bias voltage is about zero. The deposition may be performed for about 11.5 seconds.

After the deposition, the reactor 300 is purged for about 10 seconds at a nitrogen flow in a range from about 7600-9600 sccm, for example at a nitrogen flow of about 8600 sccm, and substantially zero silane flow and ammonia flow. The spacing h in the purging is 2100 mils. Finally, gases in the vessel 301 are pumped off.

The copper concentrations in the silicon nitride layers according to the present invention are about the same as in the unstressed silicon nitride layers. Consequently, a silicon nitride layer having a compressive stress provides an efficient copper diffusion barrier.

A further advantage of a layer according to the present invention having a compressive intrinsic stress is a good adhesion between the first stressed layer 201 and the metal silicide regions 22, 23, 24, 25, 26, 27.

The adhesion between a silicon nitride layer formed with the plasma enhanced chemical vapor deposition process for forming a layer having a compressive intrinsic stress described above and cobalt silicide has been investigated by means of a four point bending method known to persons skilled in the art. Values of the adhesion of more than 10 J/m² have been measured. Similar values have been measured for a substantially unstressed silicon nitride layer formed by means of the process for forming an unstressed layer described above. Therefore, the first stressed layer 201 can be formed without there being a reduction of the adhesion to the metal silicide regions 22, 23, 24, 25, 26, 27 compared to unstressed etch stop layers.

The first predetermined intrinsic stress need not be compressive. In other embodiments of the present invention, the first stressed layer 201 can have a tensile intrinsic stress.

Silicon nitride layers having a tensile stress may be formed by means of a plasma enhanced chemical vapor deposition process, which will be described in the following.

First, the semiconductor structure 1 is inserted into the vessel 301 as the substrate 314. Then, the reactor 300 is prepared for about 15 seconds. In the preparation, the power source 318 is in an off state, and a silane flow in a range from about 140-200 sccm, an ammonia flow in a range from about 210-310 sccm, and a nitrogen flow of about 8600 sccm are provided. In a particular embodiment of the present invention, flows of silane and ammonia of about 170 sccm and of about 260 sccm, respectively, are provided. The pressure in the vessel 301 and the temperature of the semiconductor structure 1 are controlled to be in a range from about 4.5-5.1 Torr and 400° C. For example, the pressure may be about 4.8 Torr. A spacing h in a range from about 700-1100 mils, for example a spacing of about 900 mils, is provided.

Then, the first stressed layer is deposited by activating the power source 318 to provide between the electrode 313 and the showerhead 303 a radio frequency alternating voltage having a power of about 300 W, the other parameters being substantially identical to those applied in the preparation. After the deposition, the reactor 300 is purged for about 10 seconds at a nitrogen flow of about 8600 sccm and substantially zero silane and ammonia flow. In the purging, the spacing h is about 2100 mils.

The above-described plasma enhanced chemical vapor deposition process yields silicon nitride layers having a predetermined tensile intrinsic stress of about 900 MPa. Other values of the predetermined tensile intrinsic stress may be obtained by varying the parameters of the plasma enhanced chemical vapor deposition process, in particular the spacing h and the temperature. For example, values of the first predetermined intrinsic stress in a range from about 500-900 MPa may be obtained by varying the spacing h between about 500-1000 mils. Values of the first predetermined intrinsic stress in a range from about 900-1100 MPa may be obtained by varying temperature between about 400-500° C.

Figure 2A:
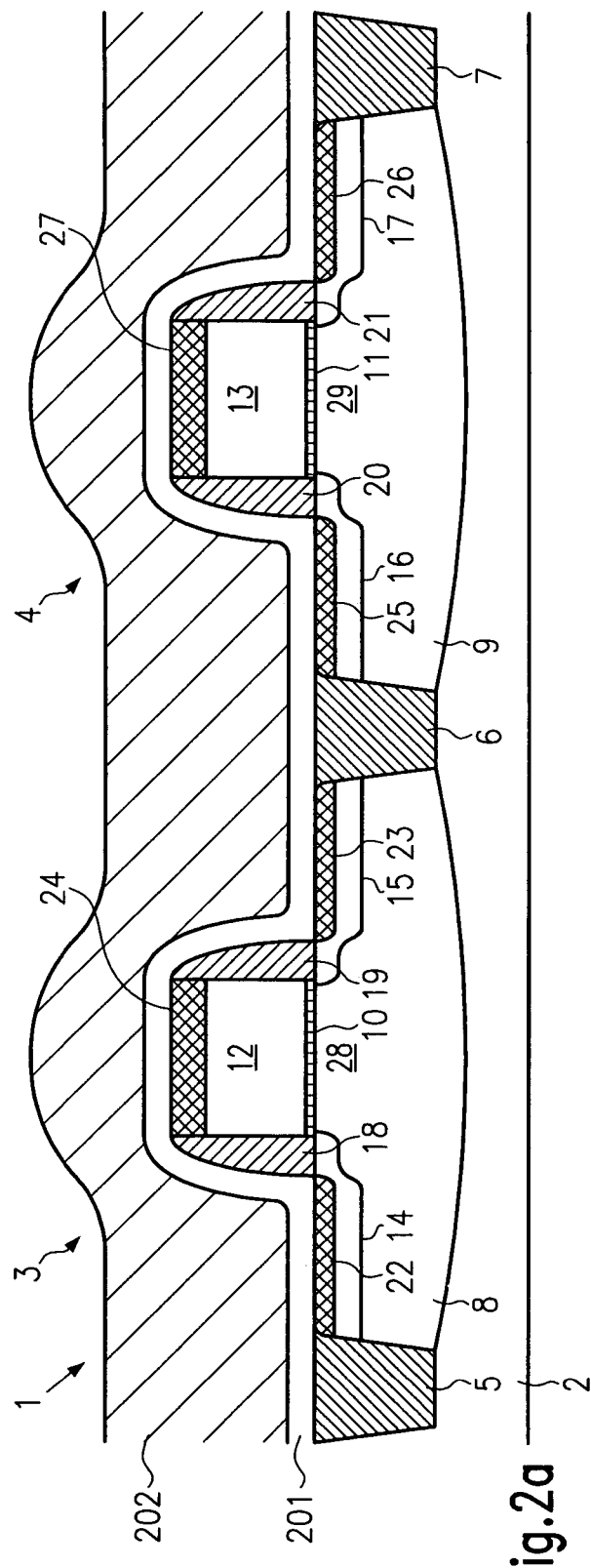
FIGS. 2a-2e show schematic cross-sectional views of a semiconductor structure in stages of a manufacturing process according to an embodiment of the present invention.

As depicted in FIG. 2*a*, after the formation of the first stressed layer 201, a first dielectric layer 202 is deposited over the semiconductor structure 1. A thickness of the first dielectric layer 202 can be greater than a height of the gate electrodes 12, 13 covered with the first stressed layer 201. Due to the topology of the underlying semiconductor structure 1, a surface of the first dielectric layer 202 is uneven. In particular, the first dielectric layer 202 comprises bumps over the gate electrodes 12, 13.

The first dielectric layer 202 can be deposited by means of chemical vapor deposition, plasma enhanced chemical vapor deposition or any other deposition process known to persons skilled in the art. The first dielectric layer 202 may comprise silicon dioxide.

Figure 2B:
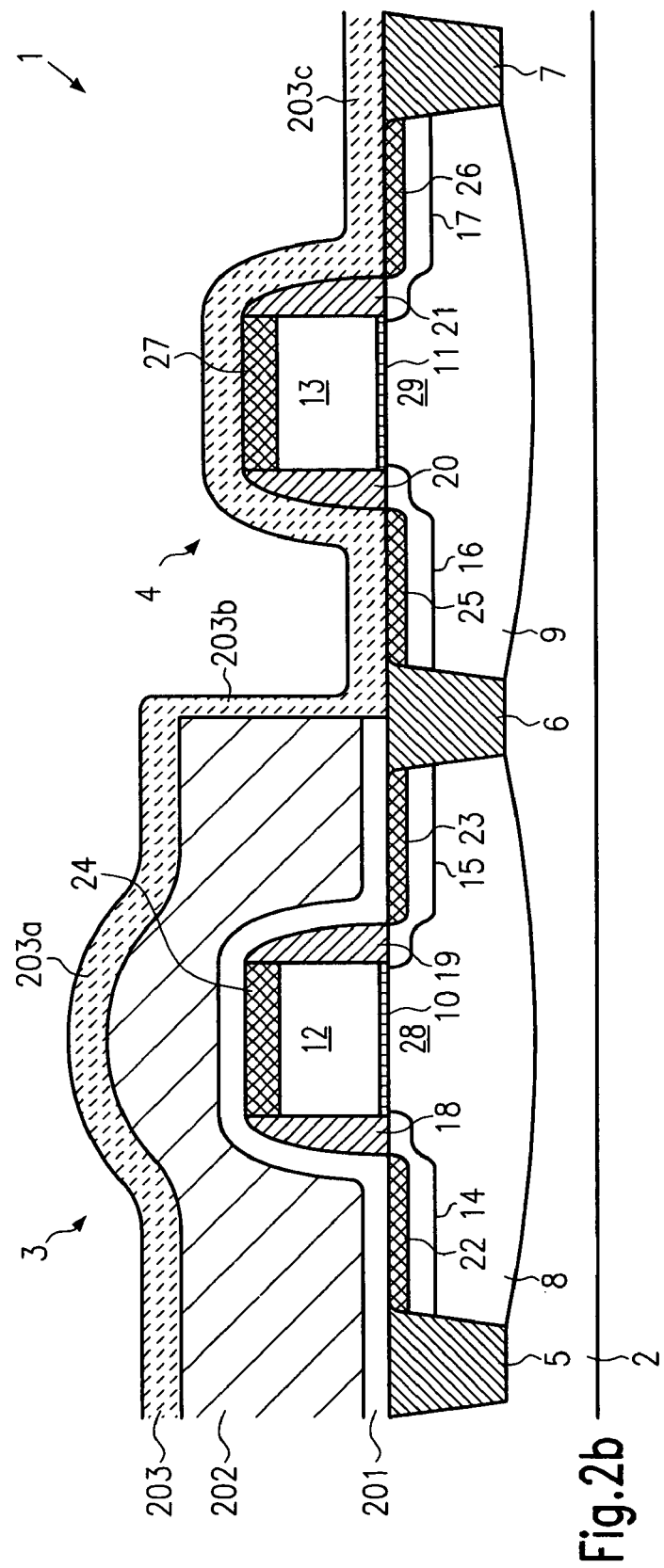

FIG. 2*b* shows a schematic cross-sectional view of the semiconductor structure 1 in a later stage of the manufacturing process. The first dielectric layer 202 is patterned by removing a portion of the first dielectric layer 202 located over the second transistor element 4. This may be done by means of techniques of photolithography and etching techniques known to persons skilled in the art. After the patterning, the first dielectric layer 202 exposes the second transistor element 4.

A portion of the first stressed layer 201 located over the second transistor element 4 may be removed after the patterning of the first dielectric layer 202. This can be done by means of an etching process. In one embodiment, the first dielectric layer 202 functions as a mask, protecting a portion of the first stressed layer 201 located over the first transistor element 3 from being exposed to an etchant.

The etching process may comprise exposing the semiconductor structure 1 to an etchant adapted to selectively remove the material of the first stressed layer 201, leaving the material of the first dielectric layer 202 and the materials of the shallow trench isolations 6, 7, the sidewall spacers 18, 19 and the metal silicide regions 24, 27 substantially intact.

In other embodiments of the present invention, the first stressed layer 201 may comprise a thin liner layer (not shown) at the lower side which is formed on the first transistor element 3 and the second transistor element 4. The liner layer may act as an etch stop layer, protecting the first transistor element 3 and the second transistor element 4 from being affected by the etchant and/or may provide an indication when the portion of the first stressed layer 201 over the second transistor element is removed.

In further embodiments of the present invention, the first stressed layer 201 is left on both of the first transistor element 3 and the second transistor element 4. A second stressed layer 203 is formed over the first dielectric layer 202 and the second transistor element 4. The second stressed layer 203 has a second predetermined stress. Portions 203*a*, 203*c* of the second stressed layer are located over the first dielectric layer 202 and the second transistor element 4, respectively. A further portion 203*b* of the second stressed layer 203 is located over an edge of the first dielectric layer 202. The edge of the first dielectric layer 202 is formed in the patterning of the first dielectric layer 202 which is performed to uncover the second transistor element 4.

The formation of the second stressed layer 203 can comprise a non-conformal deposition process adapted to deposit a stressed layer of a material over the first dielectric layer 202 and the second transistor element 4.

In non-conformal deposition, a thickness of the deposited layer of material, measured in a direction perpendicular to the underlying portion of the deposition surface, depends on the slope of the underlying portion of the deposition surface. In particular, a thickness of weakly inclined portions of the second stressed layer 203, such as portions 203*a*, 203*c* is greater than a thickness of portion 203*b* formed over the steep edge of the first dielectric layer 202.

Non-conformal deposition may be performed by applying a moderately high bias voltage in plasma enhanced chemical vapor deposition, the electrode 313 being negatively charged. Thus, ions in the plasma are accelerated in a direction perpendicular to the surface of the substrate 2. The motion of the ions in the direction perpendicular to the substrate 2 entails a material transport in this direction. The transported material is preferentially deposited on weakly inclined portions of the semiconductor structure 1. Therefore, the second stressed layer 203 has a greater thickness on the weakly inclined portions than on steep portions of the semiconductor structure 1.

Figure 2C:
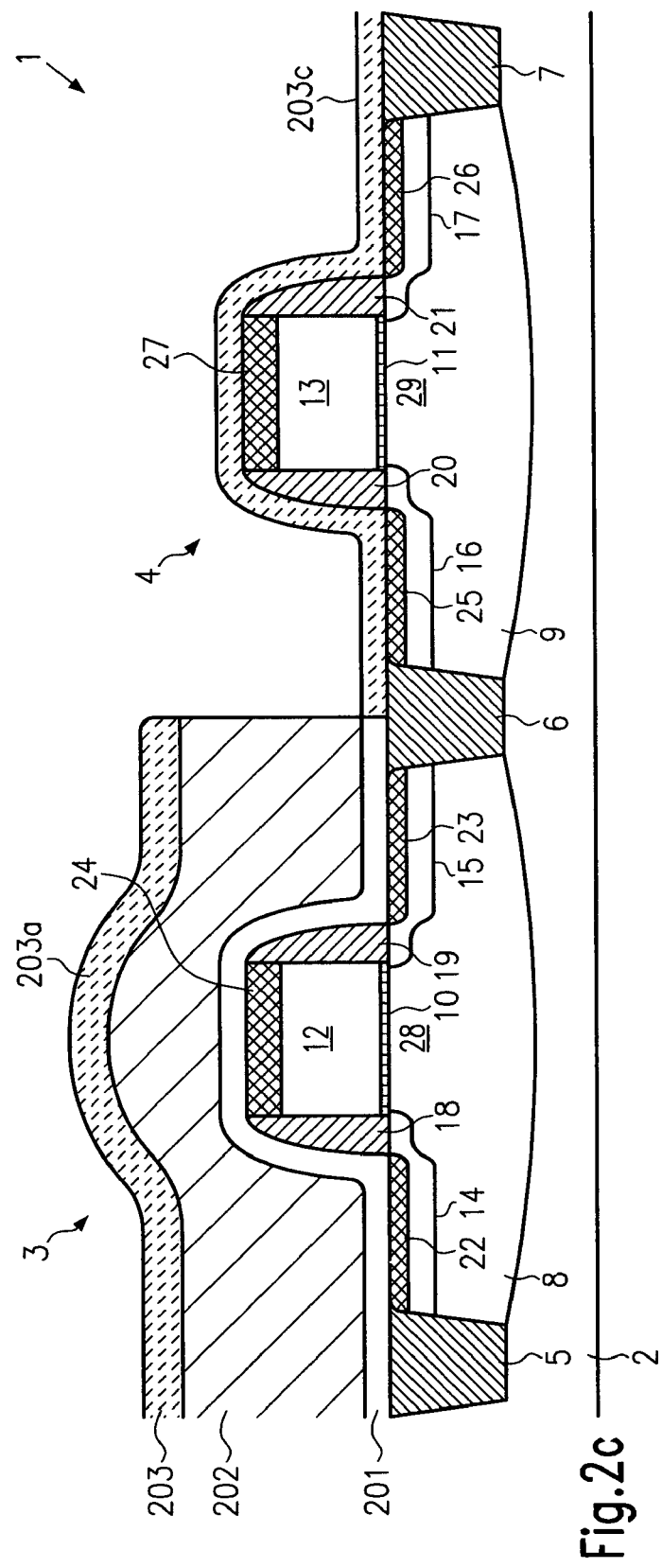

A further stage of the manufacturing process is shown in FIG. 2*c*. An isotropic etching process being adapted to substantially remove the portion 203*b* of the second stressed layer 203 located over the edge of the first dielectric layer 202 can be performed.

In isotropic etching, a rate at which material is removed is substantially independent of the slope of the etched surface. Portions 203a and 203c of the second stressed layer 203 are etched at substantially the same rate as the portion 203b located over the edge of the first dielectric layer 202. Since the portion 203b of the second stressed layer is thinner than the portions 203a, 203c, it is thus removed more quickly than the portions 203a, 203c. The etching process is stopped as soon as the portion 203b is substantially removed. Hence, parts of portions 203a and 203c remain on the semiconductor structure 1. The material loss in portions 203a, 203c may be taken into account in advance by correspondingly increasing the deposited thickness of the second stressed layer 203.

In some embodiments of the present invention, the isotropic etching may remove portions of the second stressed layer 203 located over the sidewall spacers 20, 21 which have a greater slope than, e.g., portions located over the source region 16 and the drain region 17 of the second transistor element 4.

In other embodiments of the present invention, no etching process is performed, and the portion 203b of the second stressed layer 203 is left on the semiconductor structure 1. In such embodiments, the deposition of the second stressed layer 203 need not be non-conformal. Instead, the second stressed layer 203 can be deposited conformally. The second stressed layer 203 may comprise a dielectric material, e.g., silicon nitride.

The second predetermined stress can be compressive or tensile. In embodiments of the present invention wherein the first predetermined stress is tensile, the second predetermined stress can be compressive. A compressively stressed second stressed layer 203 may be formed by means of the plasma enhanced chemical vapor deposition process according to the present invention described above. The second predetermined intrinsic stress may have an absolute value of at least about 1 GPa. In further embodiments of the present invention, the absolute value of the second predetermined intrinsic stress can be at least about 2 GPa or at least about 2.2 GPa. In case the material of the second stressed layer is deposited non-conformally, the moderately high bias voltage used in the deposition may additionally enhance the compressive intrinsic stress.

In other embodiments of the present invention, the second predetermined stress can be tensile. The second stressed layer 203, when comprising a tensile stress, may be formed by means of a plasma enhanced chemical vapor deposition process as described above for the first stressed layer 201. The second predetermined intrinsic stress, when tensile, can have a value in a range from about 500-1100 MPa.

Figure 2D:
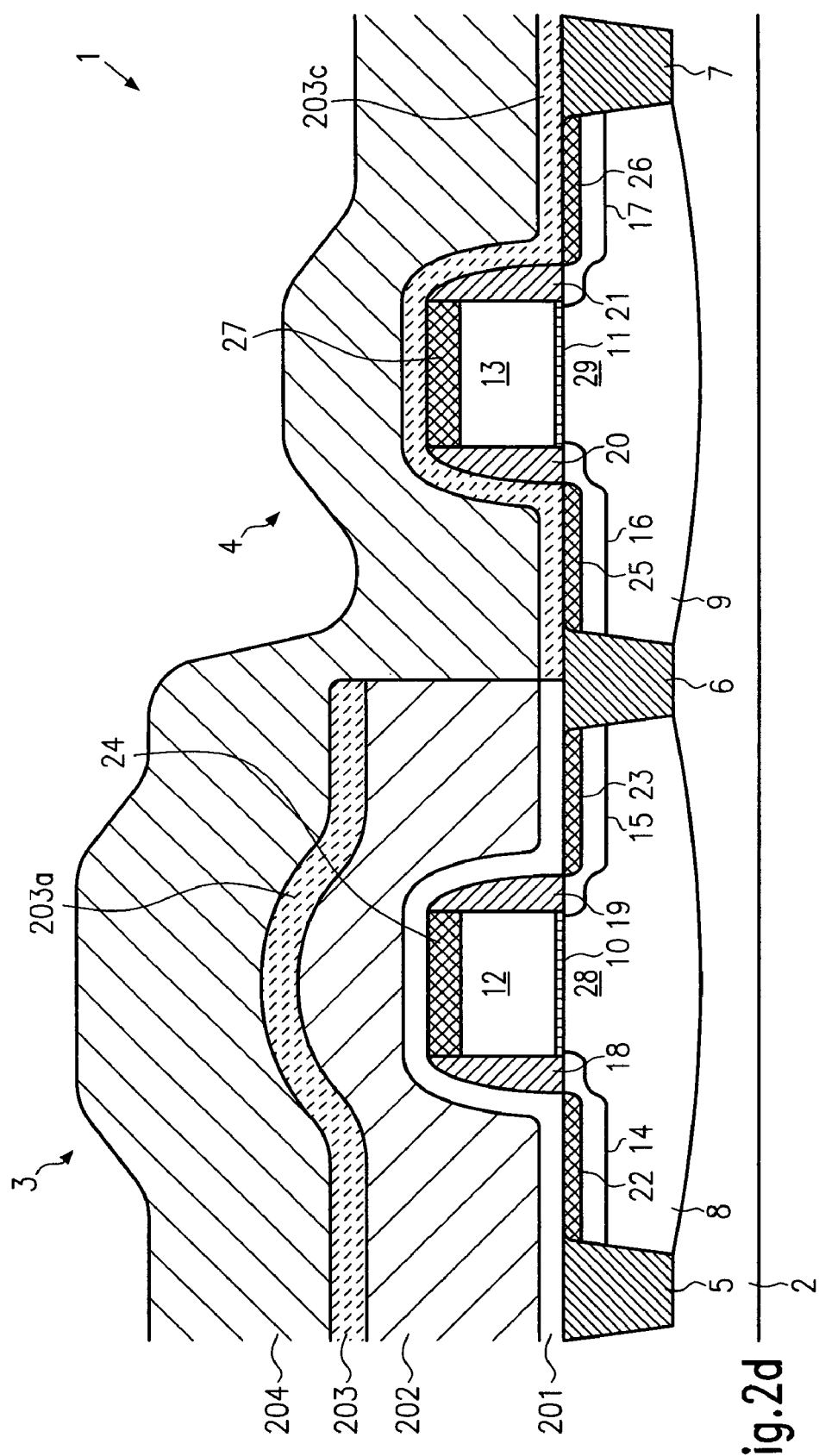

FIG. 2d shows a schematic cross-sectional view of the semiconductor structure 1 in a further stage of the manufacturing process. A second dielectric layer 204 is formed over the substrate 1. Similar to the first dielectric layer 202, the second dielectric layer 204 may be formed by means of chemical vapor deposition, plasma enhanced chemical vapor deposition or any other deposition process known to persons skilled in the art. A thickness of the second dielectric layer 204 is greater than a height of the gate electrodes 12, 13 of the first transistor element 12 and the second transistor element 13.

The second dielectric layer 204 can be formed from the same material as the first dielectric layer 202. In particular, both the first dielectric layer 202 and the second dielectric layer 204 can comprise silicon dioxide. In other embodiments of the present invention, however, the first dielectric layer 202 and the second dielectric layer 204 may comprise different materials.

The second dielectric layer 204 covers the portion 203a of the second stressed layer 203 and the second transistor element 4, which is covered by the portion 203c of the second stressed layer 203. In embodiments of the present invention where the portion 203b of the second stressed layer covering the edge of the first dielectric layer 202 is removed, the second dielectric layer 204 adjoins to the first dielectric layer 202. Due to the topography of the first dielectric layer 202 and the second transistor element 4, a surface of the second dielectric layer is uneven. In particular, the surface of the second dielectric layer 204 comprises a bump over the gate electrode 13 of the second transistor element 4, and an elevation over the first transistor element 3, where the first dielectric layer 202 and the portion 203a of the first dielectric layer 203 are located under the second dielectric layer 204.

Figure 2E:
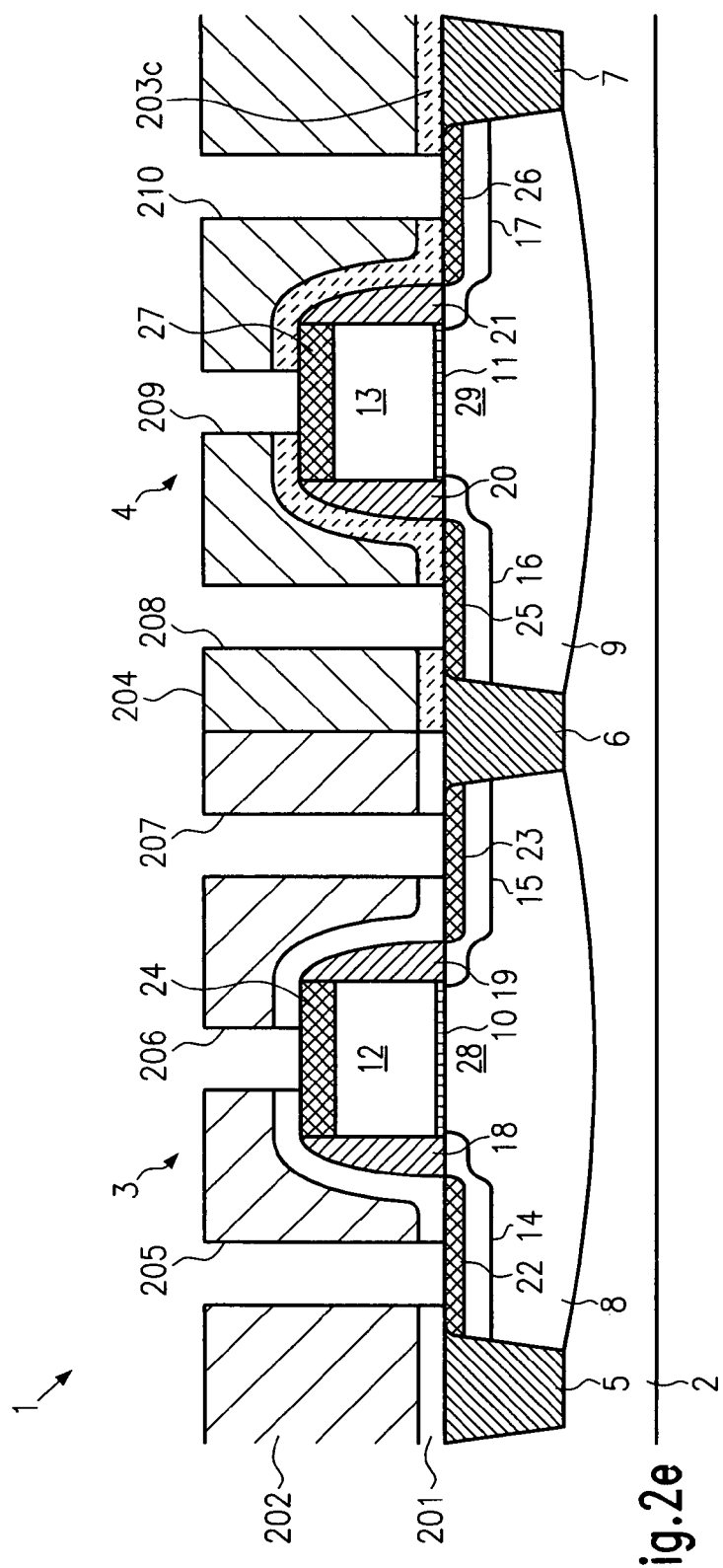

A schematic cross-sectional view of the semiconductor structure 1 in yet another stage of the manufacturing process is shown in FIG. 2e. The first dielectric layer 202 and the second dielectric layer 204 are planarized. This can be done by means of chemical mechanical polishing. In chemical mechanical polishing, the semiconductor structure 1 is moved relative to a polishing pad. Slurry is supplied to an interface between the semiconductor structure 1 and the polishing pad. The slurry comprises a chemical compound reacting with the material or materials on the surface of the semiconductor structure 1. The reaction product is removed by abrasives contained in the slurry and/or the polishing pad.

In the planarization, a portion of the second dielectric layer 204 located over the first dielectric layer 202, the portion 203a of the second stressed layer 203 and the bump of the first dielectric layer 202 over the gate electrode 12 of the first transistor element 3 are removed. After the planarization, the first dielectric layer 202 and the second dielectric layer 204 have a common, planar surface.

In embodiments of the present invention wherein the first dielectric layer 202 and the second dielectric layer 204 are formed from the same material, and the portion 203b of the second stressed layer 203 is removed, the semiconductor structure is covered by a continuous dielectric layer having a planar surface, similar to interlayer dielectrics known to persons skilled in the art. Thus, advantageously known methods may be applied for the further processing of the semiconductor structure 1 substantially without any modification.

After the planarization, contact vias 205, 206, 207 are formed in the first dielectric layer 202. In the second dielectric layer 204, contact vias 208, 209, 210 are formed. As is well known to persons skilled in the art, this can be done by photolithographically forming a mask over the first dielectric layer 202 and the second dielectric layer 204 which exposes portions of the dielectric layers 202, 204, wherein the contact vias 205-210 are to be formed. Subsequently, an anisotropic etching process is performed which is adapted to selectively remove the material of the first dielectric layer 202 and the material of the second dielectric layer 204 while an etch rate of the first stressed layer 201 and the second stressed layer 203 is significantly lower. Thus, the removal of material is reliably stopped within the first stressed layer 201 or the second stressed layer 203. Hence, the stressed layers 201, 203 function as etch stop layers.

Subsequently, an etching process adapted to remove the first stressed layer 201 and/or the second stressed layer 203 from the bottom of the contact vias 205-210 is performed.

The etching process can comprise exposing the semiconductor structure 1 to an etchant adapted to selectively remove the material of the first stressed layer 201 and the second stressed layer 203, leaving the silicide in the metal silicide regions 22, 23, 24, 25, 26, 27 and the material of the first dielectric layer 202 and the second dielectric layer 204 substantially intact.

In other embodiments of the present invention, the first stressed layer 201 and/or the second stressed layer 203 may comprise a thin liner layer (not shown) at a lower side thereof which separates the stressed layers from the first transistor element 3 and the second transistor element 4. The liner layer may act as an etch stop layer, protecting the transistor elements 3, 4 from being affected in the etching process, and/or may provide an indication when the first stressed layer 201 and/or the second stressed layer 203 are removed from the bottom of the contact vias 205-210.

Finally, the contact vias 205-210 can be filled with an electrically conductive material which may include a metal such as, e.g., tungsten. When filled with the electrically conductive material, the contact via 205 provides electrical contact to the source region 14, the contact via 206 provides electrical contact to the gate electrode 12 and the contact via 207 provides electrical contact to the drain region 15. Similarly, the contact via 208 provides electrical contact to the source region 16, the contact via 209 provides electrical contact to the gate electrode 13 and the contact via 210 provides electrical contact to the drain region 17.

In embodiments of the present invention wherein a portion of the first stressed layer 201 located over the second transistor element 4 is removed after the formation of the first dielectric layer, after the completion of the method described above the first transistor element 3 is covered by the first stressed layer 201 and the second transistor element 4 is covered by the second stressed layer 203. In other embodiments, wherein the first stressed layer 201 is left on the second transistor element 4, the first transistor element 3 is covered by the first stressed layer 201, whereas the second transistor element 4 is covered both by the first stressed layer 201 and the second stressed layer 203.

Due to the intrinsic stress in the first stressed layer 201 and the second stressed layer 203, these layers exert elastic forces to the transistor elements 3, 4. Since the first stressed layer 201 and the second stressed layer 203 cover large areas of the first transistor element 3 and the second transistor element 4, these elastic forces may modify the stress in the transistor elements 3, 4, and, in particular, the stress in the channel regions 28, 29. The stress in the channel region 28 of the first transistor element 3 is influenced by the first predetermined intrinsic stress of the first stressed layer 201.

In embodiments of the present invention wherein the first stressed layer 201 is removed from the second transistor element 4, the stress in the channel region 29 of the second transistor element 4 is influenced by the second predetermined intrinsic stress of the second stressed layer 203. Hence, if the first predetermined intrinsic stress is compressive and the second predetermined intrinsic stress is tensile, the channel region 28 is subjected to a compressive stress and the channel region 29 is subjected to a tensile stress. A compressive first predetermined intrinsic stress improves the mobility of holes in the channel region 28, which is particularly advantageous if the first transistor element 3 is a P-type transistor. A tensile second predetermined intrinsic stress improves the mobility of electrons in the channel region 29, which is particularly advantageous if the second transistor element 4 is an N-type transistor. Conversely, a tensile first predetermined intrinsic stress and a compressive second predetermined intrinsic stress are of advantage if the first transistor element 3 is an N-type transistor and the second transistor element 4 is a P-type transistor.

In other embodiments, wherein the second transistor element 4 is covered both by the first stressed layer 201 and the second stressed layer 203, both the first predetermined intrinsic stress and the second predetermined intrinsic stress influence the stress in the channel region 29. If one of the first and the second predetermined intrinsic stresses is tensile and the other is compressive, the influence of the second predetermined intrinsic stress may totally or partially compensate the influence of the first predetermined stress, such that the channel region 29 is subjected to a considerably lower stress than the channel region 28. In some embodiments of the present invention, the channel region 28 is stressed, whereas the channel region 29 is substantially unstressed.

The performance of transistor elements covered by a stressed layer according to the present invention was investigated by means of experiments. To this end, a plurality of P-type transistor elements was formed. The channel regions of the transistor elements had different lengths. Over each of the transistor elements, a stressed layer similar to the first stressed layer 201 was formed by means of a plasma enhanced chemical vapor deposition process as described above. The stressed layers comprised silicon nitride and had a compressive intrinsic stress having an absolute value of about 1.5 GPa.

For each transistor element, the off state current and the saturation current were measured by means of known methods. The off state current is a current which flows through the channel region of a field effect transistor if a gate voltage adapted to switch the channel region into the "off" state is applied. The saturation current flows through the channel region if the gate voltage is adapted to switch the channel region into the "on" state. In practical applications of field effect transistors, it is desirable to have a low off state current, since the off state current increases energy consumption and heat production in integrated circuits. In general, the off state current increases as the channel length is reduced. A high saturation current indicates a high conductivity of the channel region in the "on" state. As detailed above, the conductivity of the channel region increases as the channel length is reduced, and increases if the mobility of charge carriers in the channel region increases.

Figure 5:
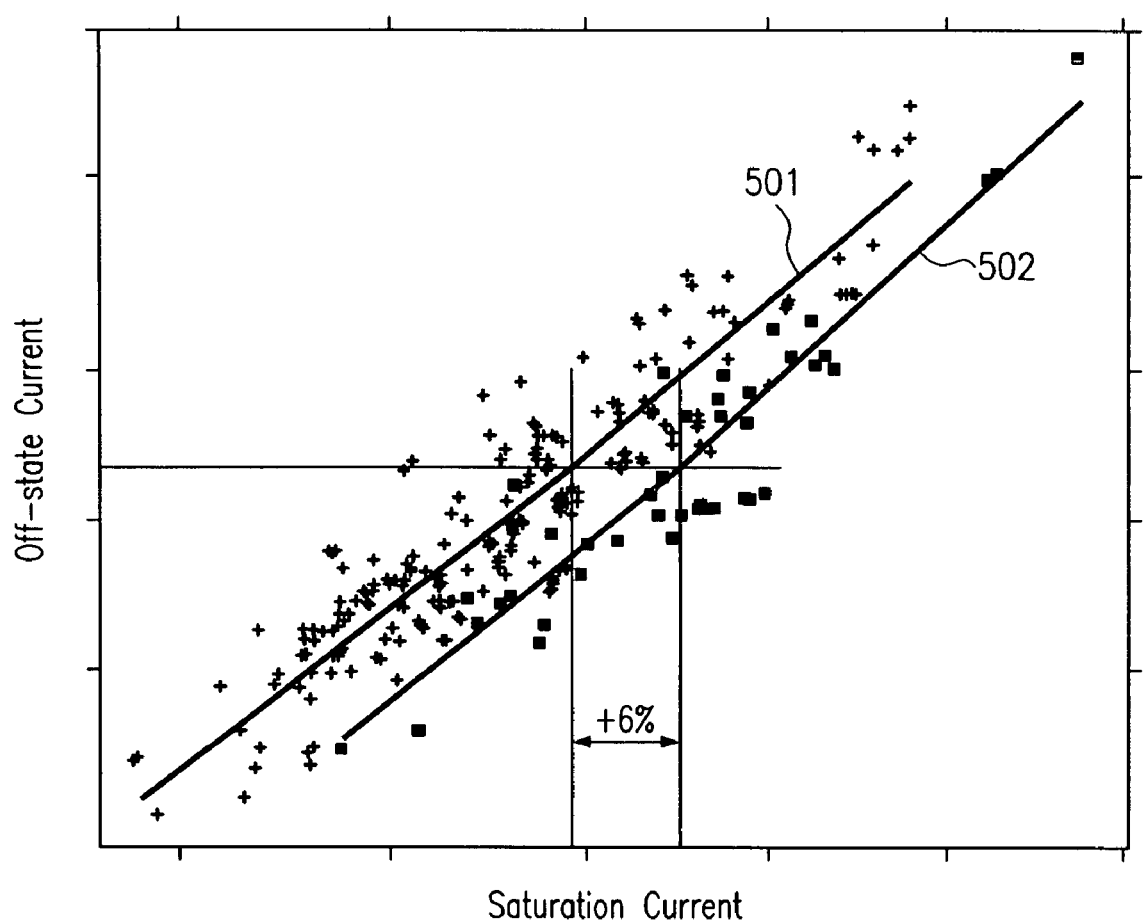
FIG. 5 shows off-state currents and saturation currents of field effect transistors in semiconductor structures according to the present invention.

Results of the measurements are shown as measurement curve 502 in FIG. 5. For comparison, similar measurements have been performed for a plurality of transistor elements over which a substantially unstressed silicon nitride layer had been formed by means of the plasma enhanced chemical vapor deposition described above. Results of a measurement of off state current and saturation current in the transistors comprising a substantially unstressed silicon nitride layer are shown as measurement curve 501 in FIG. 5.

These curves show that the provision of the stressed layer according to the present invention leads to an increase of the saturation current of a transistor by 6% compared to a transistor without such a stressed layer, for a value of the off state current which can be acceptable in an integrated circuit. Hence, it has been shown that providing a compressively stressed layer according to the present invention allows a significant improvement of the performance of P-type field effect transistors in integrated circuits. Corresponding results may be obtained for other absolute values of the first predetermined stress in the range from about 1-2.2 GPa.

The first predetermined intrinsic stress and the second predetermined intrinsic stress may be controlled to adjust the stress in each of the channel regions 28, 29. To this end, known methods for measuring the stress in the channel region of a field effect transistor such as, e.g., electron diffraction, may be used. A plurality of semiconductor structures similar to the semiconductor structure 1 is formed. In the formation of each of these semiconductor structures, different parameters are used in the deposition of the first stressed layer 201 and/or the second stressed layer 203 to obtain different values of the first predetermined intrinsic stress and the second predetermined intrinsic stress. For example, different powers of the radio frequency alternating voltage may be applied in the formation of the first stressed layer 201 and/or in the formation of the second stressed layer 203. Then, the stress in the channel regions of field effect transistors in each of the semiconductor structures is measured to relate the first and the second predetermined intrinsic stress to the stress in the channel regions. Based on the relation between the intrinsic stress in the layers 201, 203 and the stress in the channel regions, values of the first predetermined intrinsic stress and the second predetermined intrinsic stress may be determined which yield a respective desired stress in each of the channel regions 28, 29.

In other embodiments of the present invention, the first and the second predetermined intrinsic stress may be controlled to adjust a respective charge carrier mobility in each of the channel regions 28, 29. To this end, a plurality of semiconductor structures similar to the semiconductor structure 1 can be formed, each having a different first predetermined stress and/or a different second predetermined intrinsic stress than the other semiconductor structures. Then, the charge carrier mobility in the channel regions of the transistor elements in each of the semiconductor structures is measured using methods known to persons skilled in the art, and a relation between the first and the second predetermined stress and the charge carrier mobility is determined. Values of the first predetermined intrinsic stress and the second predetermined intrinsic stress yielding a desired charge carrier mobility can be obtained from this relation.

In the present invention, stress is created in the channel regions of field effect transistors by means of the first stressed layer 201 and/or the second stressed layer 203, which may be used as etch stop layers in the formation of contact vias and, thus, may replace etch stop layers used in conventional methods of forming a field effect transistor. Advantageously, providing the first stressed layer 201 and the second stressed layer 203 does not require substantial modifications of the formation of the first transistor element 3 and the second transistor element 4 compared to methods known in the art.

Figure 6A:
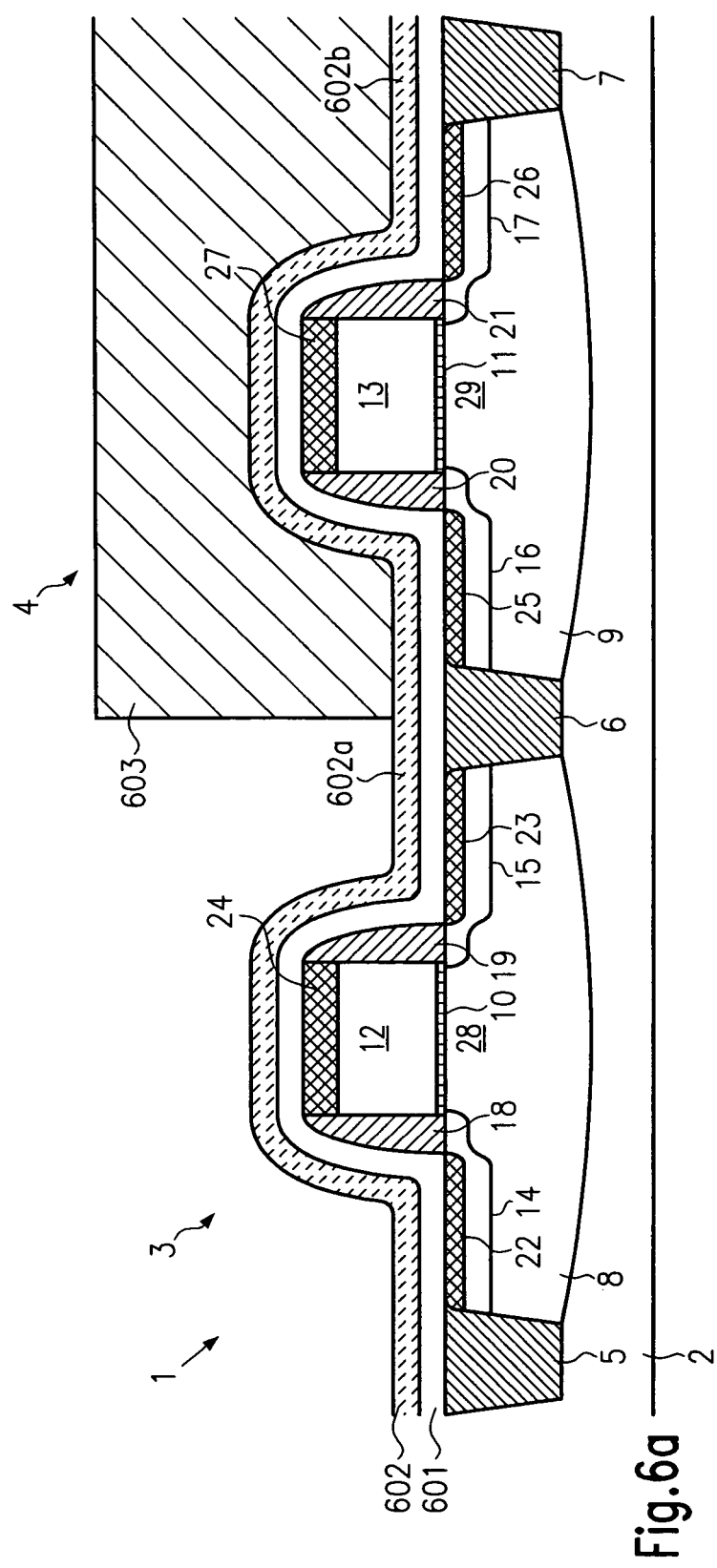
FIGS. 6a and 6b show schematic cross-sectional views of a semiconductor structure in stages of a manufacturing process according to another embodiment of the present invention.
Figure 6B:
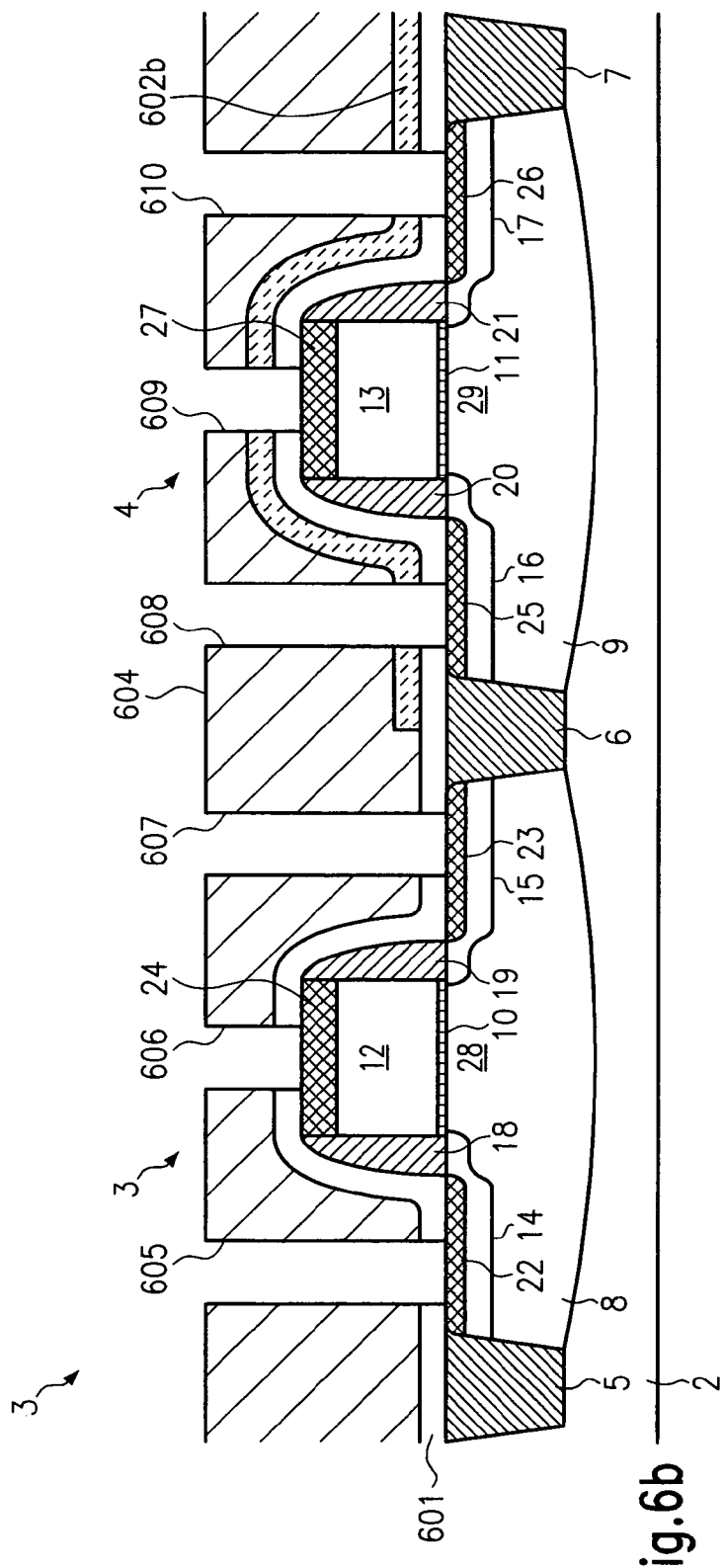

A method of forming a semiconductor structure according to a further embodiment of the present invention will be described with reference to FIGS. 6a and 6b. A semiconductor structure 1 as described above with reference to FIG. 1 is provided. Over the semiconductor structure 1, a first stressed layer 601 having a first predetermined intrinsic stress is formed. A second stressed layer 602 having a second predetermined intrinsic stress is deposited over the first stressed layer 601. The second stressed layer 602 comprises a portion 602a over the first transistor element 3 and a portion 602b over the second transistor element 4.

Similar to the first stressed layer 201 and the second stressed layer 203 in the embodiment of the present invention described above with reference to FIGS. 2a-2e, the stressed layers 601, 602 can be deposited by means of plasma enhanced chemical vapor deposition. The first predetermined intrinsic stress and the second predetermined intrinsic stress may be controlled by varying one or more parameters comprising at least one of the composition of the reactant gas, the deposition rate, the temperature, the power of the radio frequency alternating voltage, the pressure in the reactor vessel and the bias voltage. At least one of the first stressed layer 601 and the second stressed layer 602 may have a predetermined compressive intrinsic stress having an absolute value of at least about 1 GPa, of at least about 2 GPa or at least about 2.2 GPa. In the formation of the at least one of the first stressed layer 601 and the second stressed layer 602, the plasma enhanced chemical vapor deposition process can be performed as described above.

The first transistor element 3 can be a P-type transistor. The second transistor element 4 can be an N-type transistor. The first predetermined intrinsic stress can be compressive, and the second predetermined intrinsic stress can be tensile.

A mask 603 is formed over the second transistor element 4. The mask 603 can comprise a photoresist. As is well known to persons skilled in the art, a mask comprising a photoresist can be formed by applying the photoresist to the semiconductor structure 1, exposing the photoresist through a reticle and solving either the portions irradiated in the exposure or the non-irradiated portions in a developer.

In other embodiments, the mask 603 can comprise a hard mask similar to the first dielectric layer 202 in the embodiment described with reference to FIGS. 2a-2e. The hard mask may be formed by depositing a layer of a dielectric material, e.g., silicon dioxide, and patterning the layer of dielectric material by means of known techniques of etching and photolithography, similar to the formation of the first dielectric layer 202. The surface of the mask 603 need not be substantially flat, as shown in FIG. 6a, but may be uneven. In particular, the mask 603 may comprise a bump over the first transistor element 3.

Subsequently, the portion 602a of the second stressed layer 602 is removed by means of an etching process. This can be done by exposing the semiconductor structure 1 to an etchant adapted to selectively remove a material of the second stressed layer 602, leaving materials of the mask 603 and the first stressed layer 601 substantially intact. In other embodiments of the present invention, the second stressed layer 602 may comprise a thin liner layer (not shown), which is formed at the lower side thereof on the first stressed layer 601. The liner layer may function as an etch stop layer, protecting the first stressed layer 601 from an etchant used in the etching process, and/or may provide an indication when the portion 602a of the second stressed layer 602 is removed.

The mask 603 can be removed after the removal of the portion 602a of the second stressed layer 602. In embodiments of the present invention wherein the mask 603 is a hard mask, the mask 603 may remain on the semiconductor structure 1.

A dielectric layer 604 is deposited over the substrate 2. The dielectric layer 604 can be deposited by means of known methods such as chemical vapor deposition or plasma enhanced chemical vapor deposition. The dielectric layer 604 may comprise silicon dioxide.

In embodiments of the present invention wherein the mask 603 is left on the semiconductor structure 603, the dielectric layer 604 may be formed from substantially the same material as the mask 603. Thus, the mask 603 is incorporated into the dielectric layer 604 and becomes an integral part thereof. Correspondingly, a thickness of the dielectric layer 604 over the second transistor element 4 can be greater than a thickness of the dielectric layer 604 over the first transistor element 3. Hence, a surface of the dielectric layer 604 is uneven.

An unevenness of the surface of the dielectric layer 604 may also result from the presence of the gate electrodes 12, 13 on the surface of the substrate 2. A thickness of a portion of the dielectric layer 604 deposited on the gate electrodes 12, 13 can be substantially equal to a thickness of a portion of the dielectric layer 604 deposited, e.g., on the source regions 14, 16 and the drain regions 15, 17. Therefore, the dielectric layer 604 may comprise bumps over the gate electrodes 12, 13.

The dielectric layer 604 is planarized to obtain a planar surface of the dielectric layer 604. This may be done by means of chemical mechanical polishing.

Contact vias 605, 606, 607, 608, 609, 610 are formed through the dielectric layer 604, the first stressed layer 601 and/or the second stressed layer 602. The formation of the contact vias may be performed by means of etching techniques similar to those used in the formation of the contact vias 205-210 in the embodiment of the present invention described above with reference to FIGS. 2a-2e, the first stressed layer 601 and the second stressed layer 602 being used as etch stop layers. Subsequently, the contact vias 605-610 are filled with an electrically conductive material, e.g., a metal (not shown). When filled with the electrically conductive material, the contact vias 605, 606 and 607 provide electrical contact to the source region 14, the gate electrode 12 and the drain region 15 of the first transistor element 3. Similarly, the contact vias 608, 609 and 610 provide electrical contact to the source region 16, the gate electrode 13 and the drain region 17 of the second transistor element 4.

After the completion of the method described above, the first transistor element 3 is covered with the first stressed layer 601. The second transistor element 4 is covered by the first stressed layer 601 and the second stressed layer 602. The first predetermined intrinsic stress in the first stressed layer 601 and the second predetermined intrinsic stress in the second stressed layer 602 create elastic forces acting on the transistor elements 3, 4, in particular on the channel regions 28, 29. The stress in the channel region 28 of the first transistor element 3 is influenced by the first predetermined intrinsic stress. The stress in the channel region 29 of the second transistor element 4 is influenced both by the first predetermined intrinsic stress and the second predetermined intrinsic stress.

Similar to the embodiment described above with reference to FIGS. 2a-2e, the first predetermined stress and the second predetermined stress may be controlled to obtain a desired stress in each of the channel regions 28, 29, or to obtain a desired charge carrier mobility in each of the channel regions 28, 29.

The first predetermined intrinsic stress may be compressive and the second predetermined intrinsic stress can be tensile. The first predetermined intrinsic stress may be a compressive stress having an absolute value of about 1 GPa or more, of about 2 GPa or more, or of about 2.2 GPa or more. The predetermined intrinsic stresses can be adapted such that the channel region 28 is subjected to a compressive stress, whereas the channel region 29 is substantially unstressed. Thus, the mobility of holes in the channel region 28 is improved compared to that in a transistor element having a substantially unstressed channel region. This is particularly advantageous in embodiments of the present invention wherein the first transistor element 3 is a P-type transistor.

In other embodiments of the present invention, the second predetermined intrinsic stress may be a compressive stress having an absolute value of about 1 GPa or more, of about 2 GPa or more, or of about 2.2 GPa or more. The first predetermined intrinsic stress may be a tensile stress having a strength adapted such that the forces exerted by the second stressed layer on the channel region 29 of the second transistor element 4 compensate the forces exerted by the first stressed layer on the channel region 29. Thus, the channel region 29 is substantially unstressed. The channel region 28 of the first transistor element 28, to the contrary, is exposed to a tensile stress. This is particularly advantageous if the first transistor element 3 is an N-type transistor.

In further embodiments of the present invention, the first predetermined intrinsic stress may be a tensile stress having a strength adapted such that the forces exerted by the first stressed layer 601 on the channel region 29 are weaker than the forces exerted by the second stressed layer 602 having a compressive intrinsic stress. In one embodiment of the present invention, the tensile first predetermined stress may have a value between about 500-900 MPa. Thus, the channel region 28 of the first transistor element 3 is exposed to a tensile stress, whereas the channel region 29 of the second transistor element 4 is exposed to a compressive stress. Since the present invention allows providing stressed layers having a high compressive stress having an absolute value of 1 GPa or more, a moderate compressive stress in the channel region 29 may be achieved in spite of the presence of the first stressed layer 601 having a tensile stress.

The first transistor element 3 and the second transistor element 4 need not be located close to each other, as shown in FIGS. 1, 2a-2e, 6a and 6b. In other embodiments of the present invention, the transistor elements 3, 4 may be provided in different regions of the substrate 2. In some embodiments of the present invention, the substrate 2 comprises a semiconductor wafer having a plurality of dies. In such embodiments, the first transistor element 3 and the second transistor element 4 can be provided on the same die, or may be provided on different dies.

The present invention is not restricted to semiconductor structures comprising transistor elements which are exposed to different stresses, or to semiconductor structures where different stresses in different transistor elements are achieved by providing a first stressed layer and a second stressed layer over a first and/or a second transistor element.

In other embodiments of the present invention, a semiconductor structure may comprise a plurality of transistor elements similar to the transistor elements 3, 4. The transistor elements can comprise one or more P-type transistors. A stressed layer is deposited over the transistor elements. The stressed layer may have a predetermined compressive intrinsic stress having an absolute value of about 1 GPa or more, of about 2 GPa or more, or of about 2.2 GPa or more. The stressed layer may be formed by means of a plasma enhanced chemical vapor deposition process according to the present invention, as described above. Subsequently, a dielectric layer can be deposited over the plurality of transistor elements, and contact vias providing electrical contact to the transistor elements may be formed through the dielectric layer and the stressed layer. In the completed semiconductor structure, the channel regions of the plurality of transistor elements are exposed to a compressive stress induced by elastic forces exerted by the stressed layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:

providing a substrate comprising a first transistor element and a second transistor element;

forming a first stressed layer over said first transistor element;

forming a first dielectric layer over said first transistor element but not over said second transistor element;

forming a second stressed layer over said second transistor element after formation of said first dielectric layer, wherein said second stressed layer does not cover said first transistor element;

forming a second dielectric layer over said substrate after formation of said second stressed layer; and planarizing said first dielectric layer and said second dielectric layer, wherein a portion of said second dielectric layer located over said first transistor element is removed in said planarization;

wherein at least one of said first stressed layer and said second stressed layer is formed using a plasma enhanced chemical vapor deposition process performed substantially without a bias voltage and has a predetermined compressive intrinsic stress, said predetermined compressive intrinsic stress having an absolute value of at least 2 GPa.

2. The method of claim 1, wherein said absolute value of said predetermined compressive intrinsic stress is at least about 2.2 GPa.

3. The method of claim 1, wherein said first stressed layer is formed over both said first transistor element and said second transistor element.

4. The method of claim 1, wherein said first stressed layer does not cover said second transistor element.

5. The method of claim 1, wherein said at least one of said first stressed layer and said second stressed layer comprises silicon nitride.

6. The method of claim 1, wherein said plasma enhanced chemical vapor deposition process is performed at a temperature of about 400° C.

7. The method of claim 1, wherein performing said plasma enhanced chemical vapor deposition process comprises:

providing a flow of silane, a ratio between said flow of silane and a volume of a reactor vessel being in a range from about 0.0054-0.01 sccm/cm3;

providing a flow of ammonia, a ratio between said flow of ammonia and said volume of said reactor vessel being in a range from about 0.019-0.042 sccm/cm3; and providing a flow of nitrogen, a ratio between said flow of nitrogen and said volume of said reactor vessel being in a range from about 0.71-0.77 sccm/cm3.

8. The method of claim 1, wherein said plasma enhanced chemical vapor deposition process is performed at a pressure in a range from about 4.2-4.8 Torr.

9. The method of claim 1, wherein performing said plasma enhanced chemical vapor deposition comprises applying a radio frequency alternating voltage, a ratio between a power of said radio frequency alternating voltage and an area of a surface of said substrate having a value of at least 1.45 W/cm2.

10. The method of claim 1, wherein performing said plasma enhanced chemical vapor deposition comprises applying a radio frequency alternating voltage, a ratio between a power of said radio frequency alternating voltage and an area of a surface of said substrate having a value of at least 1.80 W/cm2.

11. The method of claim 1, wherein performing said plasma enhanced chemical vapor deposition comprises applying a radio frequency alternating voltage, a ratio between a power of said radio frequency alternating voltage and an area of a surface of said substrate having a value of at least 1.92 W/cm2.

12. The method of claim 1, wherein said first stressed layer is formed on a source region and a drain region of said first transistor element.

13. The method of claim 1, further comprising forming at least one first contact via through said first stressed layer and forming at least one second contact via through said second stressed layer, said at least one first contact via being located over said first transistor element, said at least one second contact via being located over said second transistor element.

14. The method of claim 1, wherein the plasma enhanced chemical vapor deposition process includes a deposition portion and a purge portion, and the method further comprises maintaining a spacing between a showerhead and the substrate constant during the deposition portion and the purge portion.

* * * * *